United States Patent [19]
Matsushita et al.

[11] 4,015,280
[45] Mar. 29, 1977

[54] MULTI-LAYER SEMICONDUCTOR PHOTOVOLTAIC DEVICE

[75] Inventors: Takeshi Matsushita, Sagamihara; Takayoshi Mamine, Tokyo, both of Japan

[73] Assignee: Sony Corporation, Tokyo, Japan

[22] Filed: Oct. 15, 1975

[21] Appl. No.: 622,500

[30] Foreign Application Priority Data
Oct. 19, 1974 Japan .............................. 49-120616

[52] U.S. Cl. .................................. 357/30; 357/38; 136/89 EE
[51] Int. Cl.$^2$ ........................................ H01L 31/04
[58] Field of Search ........... 357/30, 37, 38; 136/89; 250/211 J

[56] References Cited
UNITED STATES PATENTS

| | | | |
|---|---|---|---|
| 2,993,154 | 7/1961 | Goldey et al. | 357/38 |
| 3,015,762 | 1/1962 | Shockley | 136/89 |
| 3,046,459 | 7/1962 | Anderson et al. | 357/30 |
| 3,081,370 | 3/1963 | Miller | 136/89 |
| 3,186,873 | 6/1965 | Dunlap, Jr. | 357/30 |
| 3,361,594 | 1/1968 | Iles et al. | 357/30 |
| 3,590,344 | 6/1971 | Roberts et al. | 357/30 |
| 3,615,855 | 10/1971 | Smith | 357/30 |
| 3,936,319 | 2/1976 | Anthony et al. | 136/89 |

OTHER PUBLICATIONS
Wolfe, "Limitations and Possibilities for Improvement of Photovoltaic Solar Energy Converters," Proceedings of IRE, vol. 48, No. 7, July 1960, pp. 1246–1263.

Primary Examiner—Michael J. Lynch
Assistant Examiner—James W. Davie
Attorney, Agent, or Firm—Lewis H. Eslinger; Alvin Sinderbrand

[57] ABSTRACT

A semiconductor photovoltaic device is comprised of 2n layers of alternating p-type and n-type material having respective PN junctions between adjacent layers, wherein n is an integer greater than 1. Each layer has a thickness which is less than the diffusion length of a minority carrier therein. The PN junctions are excited by light which is incident on the device to thereby cause majority carriers to be accumulated in the respective layers so as to forward bias all of the PN junctions. As a result of this forward biasing, minority carriers are injected across a first PN junction from one layer into an adjacent layer and then traverse the next PN junction into the next succeeding layer. The photovoltaic device thus is adapted to supply a voltage and a current to a load.

18 Claims, 22 Drawing Figures

MULTI-LAYER SEMICONDUCTOR PHOTOVOLTAIC DEVICE

BACKGROUND OF THE INVENTION

This invention relates to a photovoltaic device adapted to provide electrical energy in response to irradiation and, more particularly, to a multi-layer semiconductor photovoltaic device having improved photoelectric conversion efficiency.

The phenomenon of converting light energy into electrical energy has long been known. Photoelectric cells adapted to perform this function have been in existence for many years. However, these devices have not been readily utilized because they suffer from low photoelectric conversion efficiency and from low photovoltaic energy density. That is, the wattage per square centimeter which is produced in response to incident light is undesirably low. Consequently, the electrical energy which can be produced by such photoelectric cells is undesirably low and is not suited for many applications.

As is known, the spectrum of radiant energy having the very high frequencies so as to be classified as light, such as the solar spectrum, is comprised of various frequencies, or wave lengths. It is also known that if the energy included in incident light exceeds the band gap energy of certain semiconductor materials, the material will be sufficiently excited so that an electron is emitted, or at least freed so as to support an electric current. That is, when the photon energy $hf$, wherein $h$ is Planck's constant and $f$ is the frequency of the incident light, exceeds the band gap energy $E_g$, electrons in the valance band of the semiconductor material are excited into the conduction band so as to form a hole-electron pair. These charge carriers are adapted to provide a current.

Most photoelectric cells heretofore known are formed of only two regions, or layers, constituted by P-type material adjacent a N-type material, thereby defining a PN junction therebetween. Electrodes are attached to the respective P and N materials so as to supply an output voltage and an output current when the photoelectric cell is irradiated. In accordance with the known photoelectric phenomenon, incident light whose energy is $hf$ excites an electron in the valence band into the conduction band, thereby forming the aforenoted electron-hole pair. That is, the electron now in the conduction band is paired with a hole in the valence band from whence the electron came. The electric field across the PN junction separates the electron-hole pair so that the electron is collected in the N-type region and the hole is collected in the P-type region. Because of this charge migration, the Fermi level is not continuous across the PN junction. Rather, there is a difference in the Fermi level between the P-type region and the N-type region, resulting in a photovoltaic output voltage $V_o$ which is proportional to this difference. This output voltage can be utilized by connecting a suitable load to the photoelectric cell.

The semiconductor photoelectric cell is subjected to various losses therein, some of which are capable of being diminished, while others are theoretically impossible to reduce. These losses are as follows:

Optical loss: This is the loss in the light energy caused by reflection at the surface of the photoelectric cell and by transmission of light through the cell without absorption.

Quantum loss (long wavelength): This is a loss in photon energy wherein $hf$ is less than the band gap energy $E_g$.

Quantum loss (short wavelength): This is the loss in the photon energy which is much higher than the band gap energy and is converted to heat. It is considered that the conversion of photon energy to heat and not to electrical energy is a loss.

Collection loss: This is the loss due to the recombination of minority carriers which, after being diffused across the PN junction are recombined with majority carriers. It is considered that, if not for this recombination, the diffusion of minority carriers can be derived as a useful current.

Potential factor loss: This is the loss caused by the drop in potential energy of a charge carrier when the carrier crosses the PN junction.

Impedance factor loss: This is the loss in energy caused by the internal resistance of the photoelectric cell and the leakage current across the PN junction.

Although most known semiconductor photoelectric cells are formed of only two layers, a multiple junction photoelectric cell has been described by M. Wolf in Proceedings of IRE, Vol. 48, No. 7, p. 1246. A multi-layer semiconductor device also is described in U.S. Pat. No. 3,046,459 and in U.S. Pat. No. 3,186,873. However, some of the layers of these multi-layer devices exhibit long diffusion lengths. Consequently, it is expected that the collection loss in these multi-layer devices is high, resulting in relatively low photoelectric efficiency and low photovoltaic energy density. Accordingly, these prior art devices are not well suited for many applications as a semiconductor photoelectric cell.

OBJECTS OF THE INVENTION

Therefore, it is an object of the present invention to provide a semiconductor photovoltaic device having high photoelectric efficiency.

Another object of the present invention is to provide an improved semiconductor photovoltaic device having relatively low collection loss.

Yet another object of this invention is to provide an improved semiconductor photovoltaic cell wherein the photoelectric efficiency and the output power produced thereby have small temperature dependent characteristics.

An additional object of this invention is to provide a multi-layer photovoltaic device with improved efficiency so that a relatively higher output voltage and output current is produced in response to incident light than has heretofore been possible.

Yet an additional object of this invention is to provide an improved multi-layer semiconductor photovoltaic device wherein each layer is provided with a thickness less than the diffusion length of a minority carrier therein.

Another object of this invention is to provide an improved multi-layer semiconductor photovoltaic device capable of supporting transistor action to thus improve the photoelectric efficiency and reduce the collection loss.

Various other objects and advantages of this invention will become apparent from the ensuing description, and the novel features will be particularly pointed out in the appended claims.

SUMMARY OF THE INVENTION

In accordance with the present invention, a semiconductor photovoltaic device is formed of 2n layers of alternating P-type and N-type material, wherein n is an integer greater than 1, the adjacent P-type and N-type materials defining PN junctions; wherein each layer has a thickness less than the diffusion length of a minority carrier therein, so that when the PN junctions are excited by light which is incident on the device, electrons are accumulated in the N-type material on one side of a PN junction and holes are accumulated in the P-type material on the other side of this junction so as to forward bias all of the PN junctions. As a result of the forward bias PN junctions, transistor action occurs in each set of three successive layers so that a carrier is injected from a first of these successive layers into the next adjacent layer and thence into the following successive layer so as to support a current therethrough. The opposite outermost layers of the semiconductor photovoltaic device are adapted to supply a current to a load connected thereto.

BRIEF DESCRIPTION OF THE DRAWINGS

The forthcoming detailed description will best be understood in conjunction with the accompanying drawings in which, by way of example.

DETAILED DESCRIPTION OF CERTAIN ONES OF THE PREFERRED EMBODIMENTS

Figure 1:
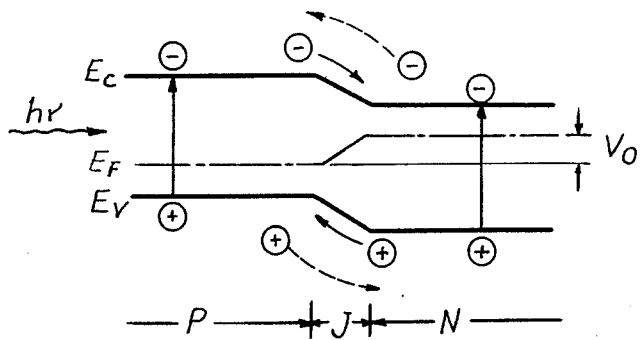
FIG. 1 is useful in explaining the carrier migration at a PN junction.

Referring now to the drawings, FIG. 1 represents the charge carrier migration at a junction J defined by P-type and N-type material. If it is assumed that the incident light has a photon energy $hf$ which exceeds the band gap energy $E_g$, then an electron in the P-type material is excited from the valence band $E_V$ to the conduction band $E_c$, as shown, to form an electron-hole pair. Similarly, in the N-type material, an electron is excited from the valence band $E_v$ into the conduction band $E_c$, to also form an electron-hole pair. As is known, the electrons in the conduction band $E_c$ in the P-type material drift across the junction J and drop into the N-type material. Similarly, the holes in the valence band $E_v$ in the N-type material rise across the junction J into the P-type material. This is depicted by the solid lines in FIG. 1. This drift current causes a difference in charge concentration across the junction J. As a result of this charge concentration differential, a diffusion current is formed whereby electrons are injected from the N-type material into the P-type material and holes are injected from the P-type material into the N-type material. This diffusion current is depicted by the broken lines in FIG. 1. As is seen, the drift current is in an opposite direction from the diffusion current.

When the drift and diffusion currents are in balance, an output voltage $V_o$ exists across the P-type and N-type materials. While the migration of charge carriers in the drift current can be used to obtain an output current from the device, the charge carriers which are injected as minority carriers ultimately recombine. That is, the electrons which are injected into the P-type material will recombine with a hole therein and the holes which are injected into the N-type material will recombine with the electrons therein. Consequently, the diffusion current generally cannot be exploited to produce an output current. Since useful results are not readily attained from the diffusion current, it is appreciated that the overall photoelectric efficiency of the device represented in FIG. 1 is diminished. Also, since the diffusion current increases as ambient temperature increases, the recombination of the injected minority carriers with majority carriers results in an effective further decrease in the photoelectric efficiency.

Figure 2A:
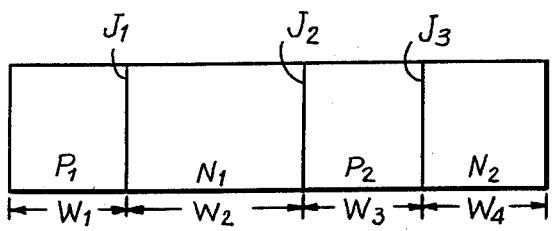
FIGS. 2A-2D schematically represent the occurrences at respective PN junctions in a multi-layer photovoltaic device and further schematically illustrate an equivalent circuit describing these occurrences.

The mechanics of carrier migration in a 4-layer device now will be described with reference to FIGS. 2A-2D. It will be assumed that the device 1 shown in FIG. 2A is a pnpn photoelectric cell comprised of a first P-type region $P_1$, a first N-type region $N_1$, a second P-type region $P_2$ and a second N-type region $N_2$ which form the PN junctions $J_1$, $J_2$ and $J_3$, respectively, as shown. The thickness, or width, of the respective regions $P_1$, $N_1$, $P_2$, $N_2$ are $W_1$, $W_2$, $W_3$ and $W_4$, respectively.

Figure 2B:
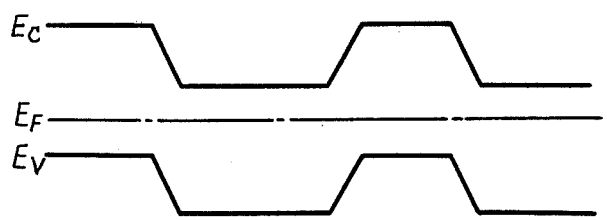
Figure 2C:
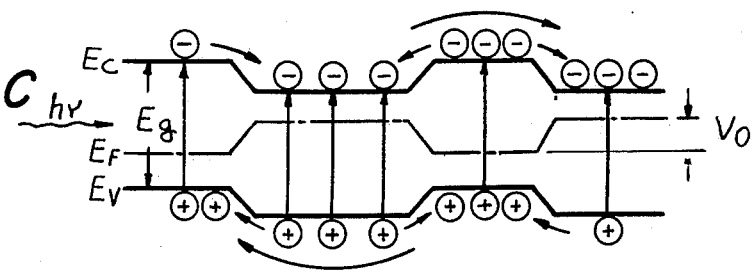

FIG. 2B depicts the band energy of the respective regions of the device 1 in the absence of incident light. The level $E_F$ shows the Fermi level, whereas $E_c$ is the lower level of the conduction band and $E_v$ is the upper level of the valence bands. Now, when light is incident on the $P_1$ region, as shown in FIG. 2C, electrons in the valence bands $E_v$ will be excited to the conduction band $E_c$, provided that the photon energy exceeds the band gap energy. This excitation of electrons creates electron-hole pairs. It is appreciated that the holes which are created in the $P_1$ region remain therein, while the electrons in the conduction band drift "downhill" into the $N_1$ region under the influence of the electric field across the junction $J_1$.

In similar fashion, electron-hole pairs are created in each of the regions $N_1$, $P_2$ and $N_2$. Electrons will remain in the N-type regions while the holes therein will drift "uphill" into the adjacent $P_1$ and $P_2$ regions under the influence of the electric field across the respective PN junctions, as shown in FIG. 2C. In the $P_2$ region, the electrons created in the electron-hole pairs will drift "downhill" into the $N_1$ and $N_2$ regions, while the holes in the $P_2$ region remain therein. Because of this phenomenon, electrons will accumulate in the $N_1$ and $N_2$ regions as majority carriers and holes will accumulate in the $P_1$ and $P_2$ regions as majority carriers therein.

It is recalled that this accumulation of majority carriers in the respective regions causes a charge concentration differential sufficient to inject minority carriers into a region. That is, electrons are injected across the junctions $J_1$ and $J_2$ from the $N_1$ region into the $P_1$ and $P_2$ regions, respectively, as minority carriers. Similarly, electrons are injected across the junction $J_3$ from the $N_2$ region into the $P_2$ region as minority carriers. Also, holes are injected into the respective $N_1$ $N_2$ regions as minority carriers by the adjacent P-type regions. A problem attending prior art devices is that these injected minority carriers, which create a minority carrier diffusion current, recombine with the majority carriers to reduce the photoelectric efficiency of the cell. This problem is overcome in accordance with the present invention by providing the width $W_2$ of the $N_1$ region and the width $W_3$ of the $P_2$ region, both inner regions of the device 1, to be less than the diffusion length of the minority carriers therein. Thus, the width $W_2$ is less than the diffusion length $L_p$ of holes which are injected into the $N_1$ region and the width $W_3$ is less than the diffusion length $L_n$ of electrons which are injected into the $P_2$ region. The diffusion length is determined by the square root of the product of the minority carrier lifetime and a minority carrier diffusion constant. Thus, the respective widths of the inner regions of the device 1 can be represented by the following mathematical inequalities:

$$W_2 < L_p = \sqrt{D_p \tau_p} \qquad (1)$$

$$W_3 < L_n = \sqrt{D_n \tau_n} \qquad (2)$$

where $D_p$ and $D_n$ are the diffusion constants of the minority carriers (holes and electrons, respectively) in the $N_1$ and $P_2$ regions, and $\tau_p$ and $\tau_n$ are the minority carrier lifetimes in the $N_1$ and $P_2$ regions, respectively.

Because of the forward biasing of the junctions $J_1$, $J_2$ and $J_3$ due to the majority carrier accumulation in the respective regions, and because of the fact that the thicknesses of the inner regions of the device 1 are less than the respective minority carrier diffusion lengths, transistor action in the device is enabled. That is, electrons in the $N_1$ region are injected into the $P_2$ region and traverse this region to cross the junction $J_3$ into the $N_2$ region. This movement of the electrons across the junctions $J_2$ and $J_3$ is due to transistor action so that an npn transistor can be considered to be formed of an emitter $N_1$, a base $P_2$ and a collector $N_2$.

Similar transistor action occurs to inject a hole from the $P_2$ region into the $N_1$ region, this hole then traversing the $N_1$ region as a diffusion current and then across the junction $J_1$ into the $P_1$ region. Hence, it can be considered that a pnp transistor is formed having an emitter corresponding to the $P_2$ region, a base corresponding to the $N_1$ region and a collector corresponding to the $P_1$ region. Thus, it can be seen that transistor action transports majority carriers from the respective inner regions $N_1$ and $P_2$ to the outer regions $N_2$ and $P_1$, respectively.

Figure 2D:
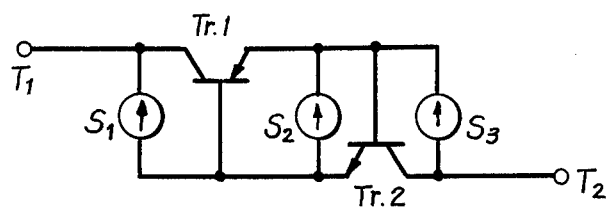

The effective pnp an npn transistors which have just been described are shown as the equivalent transistor circuits in FIG. 2D. The transistor $Tr_1$ corresponds to the pnp transistor formed of the regions $P_2$, $N_1$ and $P_1$, and the transistor $Tr_2$ corresponds to the npn transistor $N_1$, $P_2$ and $N_2$. The current sources $S_1$–$S_3$ correspond to the junctions $J_1$–$J_3$, respectively.

When the operation of the equivalent circuit shown in FIG. 2D is considered, incident light causes the current sources $S_1$ to supply holes to the output terminal $T_1$. Electrons which drift into the $N_1$ region are transported to the $N_2$ region by the transistor $Tr_2$ and are derived at the output terminal $T_2$. The incident light also operates the current source $S_2$ so that holes which drift into the $P_2$ region from the $N_1$ region are transported to the $P_1$ region by the transistor $Tr_1$ and are derived at the output terminal $T_1$. Also, electrons which drift into the $N_1$ region from the $P_2$ region are transported by the transistor $Tr_2$ to the $N_2$ region and are derived at the output terminal $T_2$. Finally, the incident light operates the current source $S_3$ to supply electrons to the output terminal $T_2$. Holes which drift into the $P_2$ region from the $N_2$ region are transported by the transistor $Tr_1$ to the $P_1$ region and are derived at the output terminal $T_1$.

Figure 3:
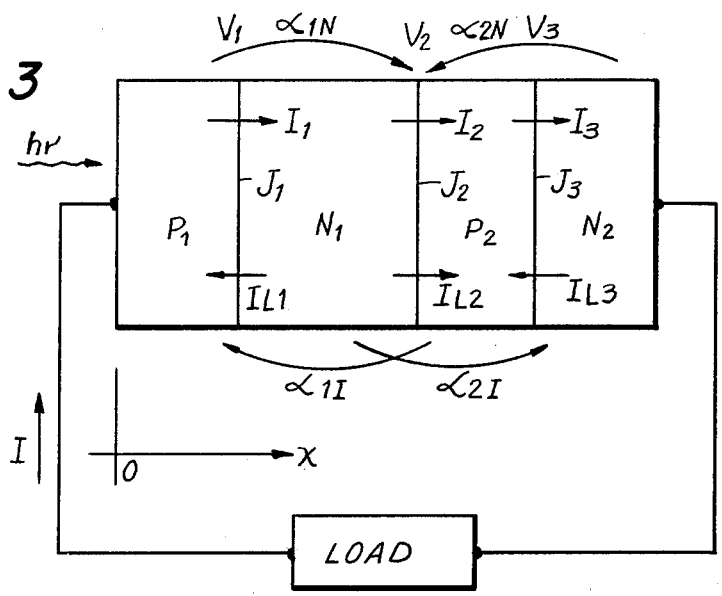
FIG. 3 is useful in explaining how output power is produced by a photovoltaic device.

The flow of charge carriers through the device 1 shown in FIGS. 2A–2C and briefly described in conjunction with the equivalent transistor circuit of FIG. 2D now will be mathematically explained in conjunction with the illustration of FIG. 3. It will be assumed that the 4-layer device is connected to a load and that current flows through the load. The positive direction of this current flow is in the $x$ direction. Since three successive regions ($P_1N_1$ $_{P2}$ and $N_2P_2N_1$) support transistor action, the total current which traverses a PN junction can be considered to be formed of individual components constituted by an injection current component, a transistor collector current component and a photovoltaic current component. Accordingly, the current $I_1$ traversing the junction $J_1$ can be mathematically expressed as follows:

$$I_1 = I_{S1}\left[\exp\left(\frac{qV_1}{AkT}\right) - 1\right] - \alpha_{11}I_{S2}\left[\exp\left(\frac{-qV_2}{AkT}\right) - 1\right] - I_{L1} \qquad (3)$$

The first term of this equation represents the injection current of both holes and electrons, the second term represents the hole collector current of the transistor $P_2N_1P_1$, wherein the $P_2$ region corresponds to the transistor emitter and the $P_1$ region corresponds to the transistor collector and the third term is the photovoltaic current consisting of electrons and holes.

Similarly, the current $I_2$ traversing the junction $J_2$ can be mathematically analyzed so as to form the expression:

$$I_2 = \alpha_{1N} I_{S1} \left[ \exp\left(\frac{qV_1}{AkT}\right) - 1 \right]$$

$$- I_{S2} \left[ \exp\left(\frac{-qV_2}{AkT}\right) - 1 \right]$$

$$+ \alpha_{2N} I_{S3} \left[ \exp\left(\frac{qV_3}{AkT}\right) - 1 \right] + I_{L2} \quad (4)$$

The first term of this expression represents the hole collector current of the transistor $P_1N_1P_2$, wherein the $P_1$ region is the transistor emitter and the $P_2$ region is the transistor collector. The second term of equation (4) represents the injection current of both electrons and holes. The third term of equation (4) represents the electron collector current of the transistor current $N_1P_2N_2$ wherein the $N_2$ region is the transistor emitter and the $N_1$ region is the transistor collector. Finally, the fourth term of equation (4) represents the photovoltaic current consisting of electrons and holes.

The current $I_3$ traversing the junction $J_3$ likewise can be mathematically analyzed in accordance with the following expression:

$$I_3 = -\alpha_{2I} I_{S2} \left[ \exp\left(\frac{-qV_2}{AkT}\right) - 1 \right]$$

$$+ I_{S3} \left[ \exp\left(\frac{qV_3}{AkT}\right) - 1 \right] - I_{L3} \quad (5)$$

The first term of equation (5) represents the electron collector current of the transistor $N_1P_2N_2$ wherein the $N_1$ region is the transistor emitter and the $N_2$ region is the transistor collector. The second term of equation (5) represents the injection current across the junction $J_3$. The third term of this equation represents the photovoltaic current.

In each of equations (3), (4) and (5), the following definitions and conventions are adopted:

$I_{S1}$, $I_{S2}$ and $I_{S3}$ represent the respective absolute values of the saturation currents which cross the junctions $J_1$, $J_2$ and $J_3$, respectively.

$I_{L1}$, $I_{L2}$ and $I_{L3}$ represent the absolute values of the photovoltaic currents which cross the respective junctions. The photovoltaic current corresponds to the aforenoted drift current; and can be likened to a form of "photomotive" force current.

$V_1$, $V_2$ and $V_3$ represent the voltages across the respective junctions having positive polarities opposite to the direction $x$.

$\alpha_{1N}$ represents the normal current amplification factor of the pnp transistor whose emitter is the P region. Current flow in this pnp transistor is represented by the corresponding arrow in FIG. 3.

$\alpha_{2N}$ represents the normal current amplification factor of the npn transistor whose emitter is the $N_2$ region. Current flow in this npn transistor is as indicated by the corresponding arrow.

$\alpha_{1I}$ represents the inverse current amplification factor of pnp transistor whose emitter now is the $P_2$ region. Current flow through this pnp transistor is as indicated by the corresponding arrow.

$\alpha_{2I}$ represents the inverse current amplification factor of the npn transistor whose emitter is the $N_1$ region. Current flow through this npn transistor is as indicated by the corresponding arrow.

A represents a constant determined by the state of the junction and is equal to or greater than unity.

$k$ is the Boltzmann constant.

$q$ is the electric charge of an electron.

T is the absolute temperature.

Equations (3), (4) and (5) can be combined in the following matrix expression:

$$\begin{bmatrix} I_1 \\ I_2 \\ I_3 \end{bmatrix} + \begin{bmatrix} 1 & -\alpha_{1I} & 0 \\ \alpha_{1N} & -1 & \alpha_{2N} \\ 0 & -\alpha_{2I} & 1 \end{bmatrix} \begin{bmatrix} I_{S1}\left(\exp\left(\frac{qV_1}{AkT}\right)-1\right) \\ I_{S2}\left(\exp\left(\frac{-qV_2}{AkT}\right)-1\right) \\ I_{S3}\left(\exp\left(\frac{qV_3}{AkT}\right)-1\right) \end{bmatrix} + \begin{bmatrix} -I_{L1} \\ I_{L2} \\ -I_{L3} \end{bmatrix} \quad (6)$$

The current through the device is continuous and may be represented as follows:

$$I_1 = I_2 = I_3 = I \quad (7)$$

The current I produced by the photovoltaic cell is seen to be negative.

From the matrix equation (6) and from equation (7) the following matrix equation can be obtained:

$$\begin{bmatrix} I_{S1}\left(\exp\left(\frac{qV_1}{AkT}\right)-1\right) \\ I_{S2}\left(\exp\left(\frac{-qV_2}{AkT}\right)-1\right) \\ I_{S3}\left(\exp\left(\frac{qV_3}{AkT}\right)-1\right) \end{bmatrix} = \begin{bmatrix} 1 & -\alpha_{1I} & 0 \\ \alpha_{1N} & -1 & \alpha_{2N} \\ 0 & -\alpha_{2I} & 1 \end{bmatrix}^{-1} \begin{bmatrix} I + I_{L1} \\ I - I_{L2} \\ I + I_{L3} \end{bmatrix} \quad (8)$$

The matrix equation (8) permits the respective junction voltages $V_1$, $V_2$ and $V_3$ to be determined. Since the output voltage V produced by the photovoltaic cell is:

$$V = V_1 + V_2 + V_3 \quad (9)$$

then, the total voltage V is mathematically expressed as:

$$V = \frac{AkT}{q}\left[\log\left\{\frac{(1-\alpha_{1I}+\alpha_{1I}\cdot\alpha_{2N}-\alpha_{2N}\cdot\alpha_{2I})I+(1-\alpha_{2N}\cdot\alpha_{2I})I_{L1}+\alpha_{1I}\cdot I_{L2}+\alpha_{1I}\cdot\alpha_{2N}\cdot I_{L3}}{(1-\alpha_{1N}\cdot\alpha_{1I}-\alpha_{2N}\cdot\alpha_{2I})I_{S1}}+1\right\}\right.$$

$$-\log\left\{\frac{(\alpha_{1N}+\alpha_{2N}-1)I+\alpha_{1N}\cdot I_{L1}+I_{L2}+\alpha_{2N}\cdot I_{L3}}{(1-_{1N}\cdot_{1I}-_{2N}\cdot_{2I})I_{S2}}+1\right\}$$

$$\left.+\log\left\{\frac{(1-\alpha_{2I}-\alpha_{1N}\cdot\alpha_{1I}+\alpha_{1N}\cdot\alpha_{2I})I+\alpha_{1N}\cdot\alpha_{2I}\cdot I_{L1}+\alpha_{2I}\cdot I_{L2}+(1-\alpha_{1N}\cdot\alpha_{1I})I_{L3}}{(1-\alpha_{1N}\cdot\alpha_{1I}-\alpha_{2N}\cdot\alpha_{2I})I_{S3}}+1\right\}\right] \quad (10)$$

The respective bracketed terms correspond to the junction voltages $V_1$, $V_2$ and $V_3$, respectively.

It is desirable to attain as high a value of the voltage V as possible, so that the photoelectric cell can be used as a power source. This is attained by providing the respective denominators of each bracketed term with a small positive value. Hence, the expression $(1-\alpha_{1N}\cdot\alpha_{1I}-\alpha_{2N}\cdot\alpha_{2I})$ should be as close to zero as possible. Also, since the total current I is negative, the voltage V will have a higher value if the expression $(\alpha_{1N}+\alpha_{2N}-1)$ in the numerator of the second bracketed term is a large positive value. These conditions are mathematically expressed as follows:

$$1-\alpha_{1N}\cdot\alpha_{1I}-\alpha_{2N}\cdot\alpha_{2I}\approx 0 \quad (11)$$

$$\alpha_{1N}+\alpha_{2N}-1>0 \quad (12)$$

It is known that the current amplification factor $\alpha$ can not be larger than unity. Accordingly, the inequality expressed in (12) indicates that it is desirable for each of $\alpha_{1N}$ and $\alpha_{2N}$ to be equal, approximately, to one. When this condition is substituted into equation (11) it is seen that, desirably, $\alpha_{1I}+\alpha_{2I}=1$.

These desired values for the respective normal and inverse current amplification factors which have been determined mathematically comply with the values of the current amplification factors which have been determined experimentally. These experimentally determined values are as follows:

$$0.65 \leq \alpha_{1N} < 1 \quad (13)$$

$$0.65 \leq \alpha_{2N} < 1 \quad (14)$$

$$0.2 \leq \alpha_{1I} \leq 0.7 \quad (15)$$

$$0.2 \leq \alpha_{2I} \leq 0.7 \quad (16)$$

In general, the normal current amplification factor of a transistor included in a multi-layer configuration, that is, where the transistor emitter is the outermost layer, desirably is greater than 0.65 and the inverse current amplification factor, that is, the current amplification factor wherein the transistor emitter is an inner layer, is desirably within the range 0.2 to 0.7. It should be appreciated that, in describing a multi-layer photoelectric device, the outermost layer, or region, refers to the layer from which the output current, or photoelectric current, is derived.

Figure 4:
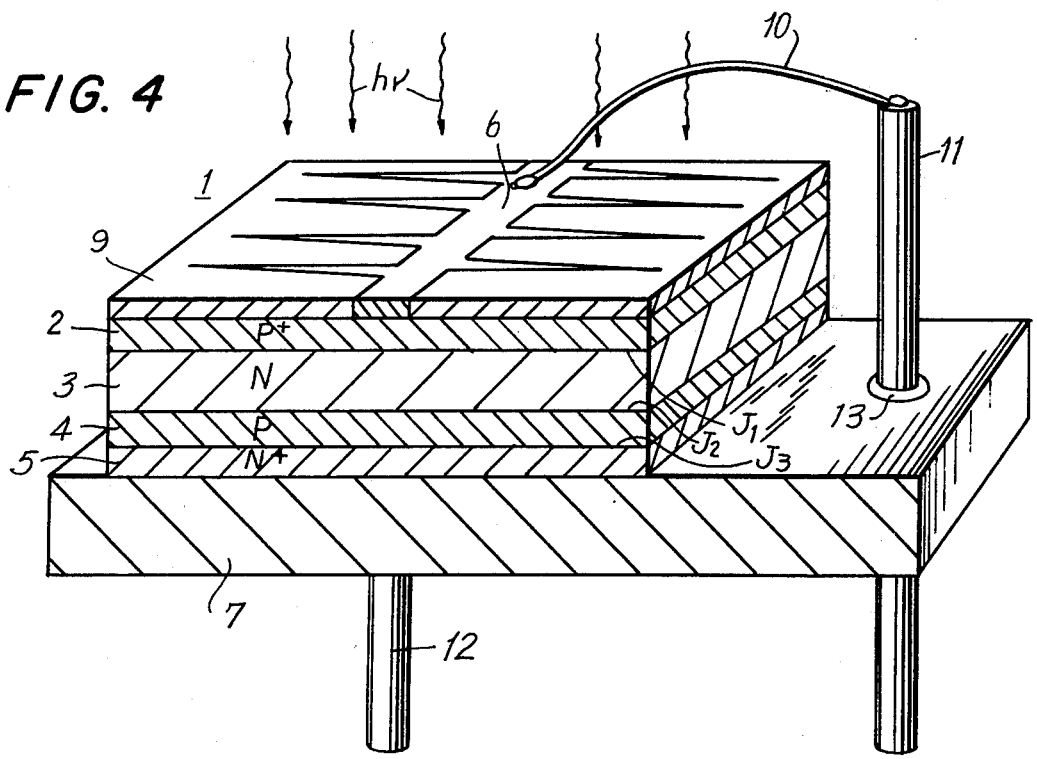
FIG. 4 is a perspective view of one embodiment of a multi-layer semiconductor photovoltaic device in accordance with the teachings of the present invention.

The foregoing desired values of the respective normal and inverse current amplification factors resulting in a higher output voltage of the multi-layer photoelectric device are attained in the physical construction of one embodiment of the present invention shown in FIG. 4. This illustrated multi-layer semiconductor photoelectric device 1 is comprised of a P+ type region 2, an N-type region 3, a P-type region 4 and an N+ type region 5. The outer P+ and N+ regions 2 and 5 are provided with electrodes 6 and 7, respectively. As shown, the electrode 6 may assume a skeletal, or fishbone-like, configuration having a main central portion and extending lateral portions. Of course, other configurations can be employed. Regardless of the particular shape of the electrode 6, incident light must be capable of being transmitted, or penetrating, into the photoelectric device. A non-reflective coating 9 is provided on the outer surface of the P+ region 2 so as to minimize optical losses. It is appreciated that the coating 9 is provided on one major surface of the multi-layer device 1.

The successive regions of alternating conductivity type material define respective PN junctions $J_1$, $J_2$ and $J_3$, respectively, between contiguous regions of opposite conductivity type material.

Briefly, during manufacture of the photoelectric device 1, a substrate, corresponding to the region 3, is first provided and the various other layers, or regions, are formed thereon. In order to mechanically handle and accommodate the substrate with suitable processing machinery, the substrate must be of sufficient thickness. Accordingly, in one embodiment, the N-type substrate 3 has a thickness of $200\mu$ (microns) which, it should be appreciated, is less than the diffusion length of the minority carrier (hole) therein, which is approximately $300\mu$. The substrate has an impurity concentration of $3\times10^{13}$ atoms/cm$^3$.

The P+ region 2 is diffused into one surface of the N-type substrate 3 and has a thickness of approximately $0.3\mu$, and an impurity concentration of $10^{20}$ atoms/cm$^3$. The P-type region is epitaxially deposited on the other surface of the N-type substrate 3 and has a thickness of approximately $5\mu$ and an impurity concentration of $10^{15}$ atoms/cm$^3$. The N+ region 5 is diffused into the exposed surface of the P-type region 4 and has a thickness of approximately $2\mu$ and an impurity concentration of $10^{21}$ atoms/cm$^3$.

As just mentioned, the diffusion length of the minority carriers (holes) in the N-type substrate is greater than $300\mu$, so that the thickness of the substrate region 3 is less than this diffusion length $L_p$. Also, since the diffusion length $L_n$ of the minority carriers (electrons) in the P-type region 4 is greater than $100\mu$, it is appreciated that the thickness of the region 4, which has been described as approximately $5\mu$, is substantially less than this minority carrier diffusion length. In the illustrated embodiment, the regions 2, 3 and 4 may be considered to be a pnp transistor and the regions 3, 4 and 5 may be considered to be an npn transistor. The normal amplification factors $\alpha_{1N}$ and $\alpha_{2N}$ of these respective transistors each is approximately 0.95, and the inverse amplification factors $\alpha_{1I}$ and $\alpha_{2I}$ of these respective transistors each is approximately 0.47.

As current flows across the respective junctions $J_1$, $J_2$ and $J_3$, both majority and minority carriers accumulate in the regions causing conductivity modulation therein. In the low injection state, that is, when the injection current has a relatively low concentration, the lifetime of the minority carriers can be represented by the following equations:

$$\frac{d(\Delta C)}{dt} = -R(P+N)\Delta C \qquad (17)$$

$$\tau = \frac{1}{R(P+N)} \qquad (18)$$

where P is the hole concentration, N is the electron concentration, $\Delta C$ is the variation in the carrier concentration and R is the recombination factor. It is recalled that there is a relationship between the minority carrier diffusion length and the minority carrier lifetime.

In the high injection state, that is, when the injection current has a high concentration, conductivity modulation occurs and the lifetime of the minority carriers tends to increase so as to be greater than the value expressed in equation (18). Equations (1) and (2), described hereinabove, can be used to express the minority carrier lifetime during the high injection state.

Figure 5:
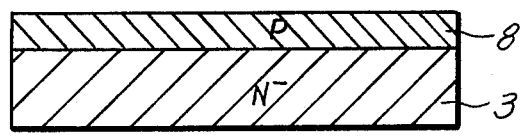
FIGS. 5-8 illustrate how the embodiment of FIG. 4 is manufactured.
Figure 6:
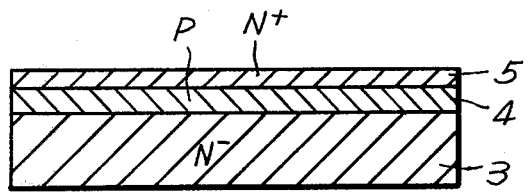

Although the manufacture of the multi-layer semiconductor photoelectric device 1 has been briefly described, reference is now made to FIGS. 5–8 in conjunction with the following more detailed explanation of the manufacturing process. The N-type substrate, shown in FIG. 5, has a thickness of approximately 200$\mu$ and is polished. A P-type layer 8, which ultimately forms the layer 4, is diffused into one layer of the substrate by boron diffusion to a depth of about 10$\mu$. Alternatively, the layer 8 can be epitaxially deposited onto the surface of the substrate. Next, phosphorous is diffused into the exposed surface of the P-type layer 8 so as to form a N+ layer 5 having a thickness of approximately 3$\mu$ and an impurity concentration of $10^{21}$ atoms/cm$^3$. It is appreciated that, when the layer 5 is diffused into the top surface of the layer 8, the respective layers 4 and 5, as shown in FIG. 6, are formed so that, at this stage in the manufacture of the photoelectric device, three successive regions of alternating conductivity type material are provided.

Figure 7:
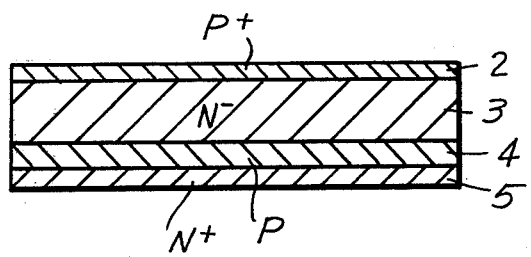
Figure 8:
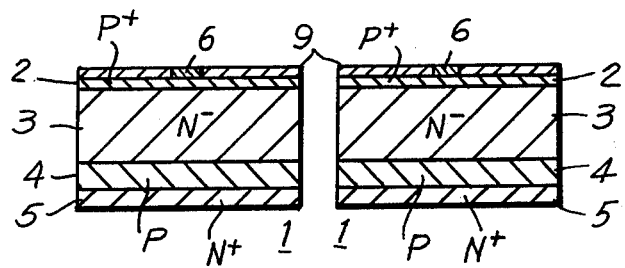

Boron is diffused into the opposite surface of the substrate 3 to form a thin P+ layer 2, as shown in FIG. 7. Then, the electrode 6, for example, of aluminum, is deposited onto the P+ region 2 in the configuration such as that shown in FIG. 4. The non-reflective coating 9, of approximately 650A is deposited over the remaining surface of the layer 2. The overall surface area of the photoelectric device shown in FIG. 7 can be great and many electrode structures 6 can be provided on the exposed surface of the layer 2. In that event, the total structure can be subdivided, as by conventional cutting techniques, into individual multi-layer semiconductor photoelectric devices. In one embodiment, each device is formed with a surface 8mm$^2$.

If the layer 8, shown in FIG. 5, is epitaxially deposited onto the substrate 3, the vicinity of the junction $J_2$, which ultimately is formed between the substrate 3 and the layer 8, can be lightly doped. A light doping concentration of $10^{13}$ to $10^{18}$ atoms/cm$^3$ is desirable. With this light doping concentration, the inverse current amplification factors $\alpha_{1I}$ and $\alpha_{2I}$ of the multi-layer device can readily be approximated to 0.5. This value is well within the range which has been determined mathematically and confirmed experimentally, as noted above. Also, if the outer layers 2 and 5 are heavily doped, the normal current amplification factors $\alpha_{1N}$ and $\alpha_{2N}$ can readily approximate unity. As described above, this value of the normal current amplification factors will improve the efficiency of a photoelectric device and will increase the output voltage produced thereby.

In the skeletal or fish-bone-type, or comb-shape configuration of the electrode 6, the lateral ribs can have a width within the range 50 to 200$\mu$. This shape is advantageous in permitting incident light to be transmitted through the nonreflective coating disposed on the light incident surface of the device 1 and to penetrate into the photoelectric device. Other configurations of the electrode 6 can be adopted provided that sufficient light is introduced into the photoelectric device.

Returning to FIG. 4, a nickel layer may be deposited on the outer surface of the N+ layer 5, and this nickel layer may be soldered to a suitable support 7 which preferably is comprised primarily of copper. The electrode 6 is connected to a lead 11 by a wire 10, and another lead 12 is connected to the support 7.

The non-reflective coating 9 is described in greater detail hereinbelow with respect to FIG. 19. It is sufficient merely to state that this layer is made of material whose refractive index n is within the range 1.8 to 2.0. As mentioned above, this non-reflective coating serves to reduce the optical losses in the photoelectric device. A suitable housing, such as of molded transparent material, may be provided to receive the multi-layer semiconductor photoelectric device 1.

Figure 9:
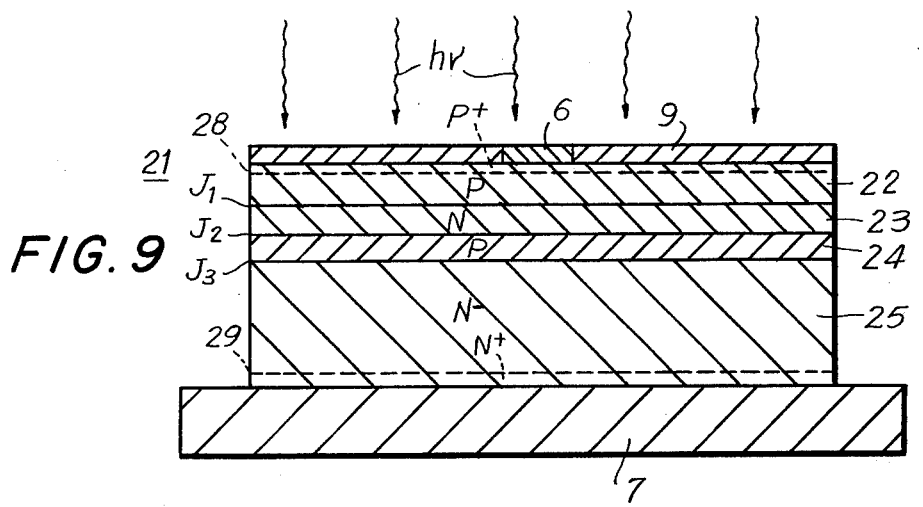
FIGS. 9-11 represent alternative embodiments of a multi-layer semiconductor photovoltaic device in accordance with the teachings of the present invention.

Another embodiment of the multi-layer semiconductor photoelectric device in accordance with the present invention is shown in FIG. 9. This photoelectric device 21 is comprised of outer regions 22 and 25 of opposite conductivity type material, and inner regions 23 and 25. As shown, the successive regions are of alternating conductivity type material, and the outer region 22 is provided with an L-H junction formed between the P-type material and more heavily doped P+ material. Similarly, the outer region 25 is provided with an L-H junction formed between the N material and N+ material. The region 25 is an N-type substrate whose thickness is suitable to undergo the various manufacturing techniques, but is less than the diffusion length of the minority carriers (holes) therein. As noted above, a typical thickness of the N-type substrate 25 is approximately 200$\mu$. The P-type region 24 is epitaxially deposited on the substrate and has a width of approximately 5$\mu$ and an impurity concentration of $10^{15}$ atoms/cm$^3$. The N-type region 23 is epitaxially deposited over the region 24 and it too has a thickness of approximately 5$\mu$ and an impurity concentration of $10^{15}$ atoms/cm$^3$. The P-type region 22 is epitaxially deposited over the region 23 and has an impurity concentration of $10^{15}$ atoms/cm$^3$. The highly doped P+ layer is diffused to a depth of about 0.3$\mu$ from the top surface of the region 20, and has an impurity concentration of $10^{20}$ atoms/cm$^3$. Finally, the highly doped N+ layer is diffused into the lower surface of the substrate 25 to a depth of about 4µ, this N+ layer having an impurity concentration of $10^{21}$ atoms/cm$^3$.

If the impurity concentration on either side of the respective L-H junctions 28 and 29 exhibits a ratio greater than $10^3$, the L-H junction will constitute a potential barrier against minority carriers. Thus, a built-in electric field is provided across the L-H junction. Furthermore, it is appreciated that the L-H junction 28 is within the diffusion length of minority carriers (electrons) which may be injected into the P-type region 22 from the N-type region 23. similarly, the L-H junction 29 is disposed within the diffusion length of the minority carriers (holes) which may be injected into the substrate 25 from the P-type layer 24. Thus, the potential barrier formed by the aforenoted impurity concentration ratio across the L-H junction is advantageous in blocking the injected minority carriers. Also, because of these L-H junctions, a pnp transistor whose emitter is the region 22 and an npn transistor whose emitter is the region 25 exhibit high emitter efficiencies because the potential barrier at the L-H junctions tends to reduce the injected base current. The normal current amplification factor $\alpha_{1N}$ of the pnp transistor is greater than 0.99 and the normal current amplification factor $\alpha_{2N}$ of the npn transistor is about 0.8. The respective inverse current amplification factors $\alpha_{1I}$ and $\alpha_{2I}$ each are about 0.5. Hence, the values of these parameters conform to the aforedescribed mathematically derived values and to the experimentally determined values.

Since all of the junctions $J_1$-$J_3$ are relatively close to the light incident surface, the illustrated multi-layer semiconductor photoelectric device is sensitive to light of short wavelength. In particular, the thickness of the substrate 25 is seen to comprise at least 90% of the overall thickness of the device. The junction $J_3$ is at a depth between 15 and 16µ from the light incident surface so that all of the PN junctions are within a depth of approximately 10% of the overall thickness of the device. Since the short wavelength of the light spectrum is utilized, it is appreciated that light of higher energy is converted into electrical energy.

Figure 10:
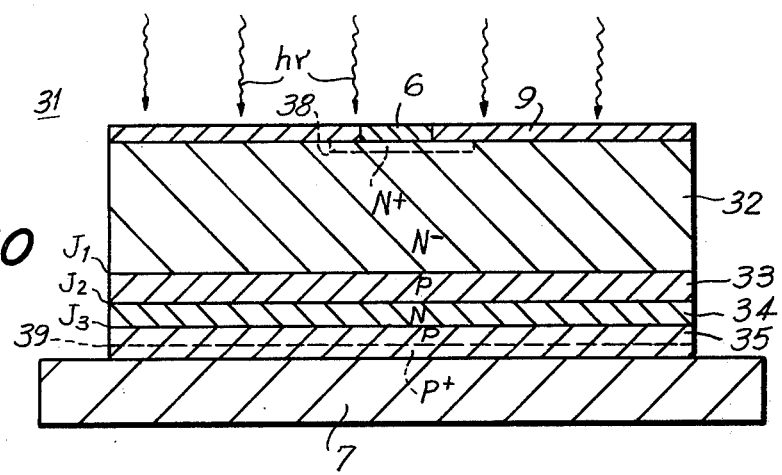

Another embodiment of a multi-layer semiconductor photoelectric device in accordance with the present invention is shown in FIG. 10. The photoelectric device 31 illustrated therein is seen to be a substantially inverted replica of the device 21 previously described with respect to FIG. 9. However, in the FIG. 10 embodiment, the N+ layer is not diffused into the entire surface of the substrate 32. Rather, the N+ layer is selectively diffused into the N-type substrate. Since a heavily doped region has a tendency of attenuating transmitted light, the selective diffusion of the N+ layer is seen to permit incident light to pass through the substrate to sufficient depths in the photoelectric device so as to be absorbed by the respective junctions. In the FIG. 10 embodiment, the substrate 32 has a thickness which is greater than about 90% of the overall thickness of the device 31. Since the junctions $J_1$-$J_3$ are relatively far removed from the light incident surface, the device 31 is sensitive to the long wavelengths of the spectrum and thus is responsive to light of a lower energy.

Figure 11:
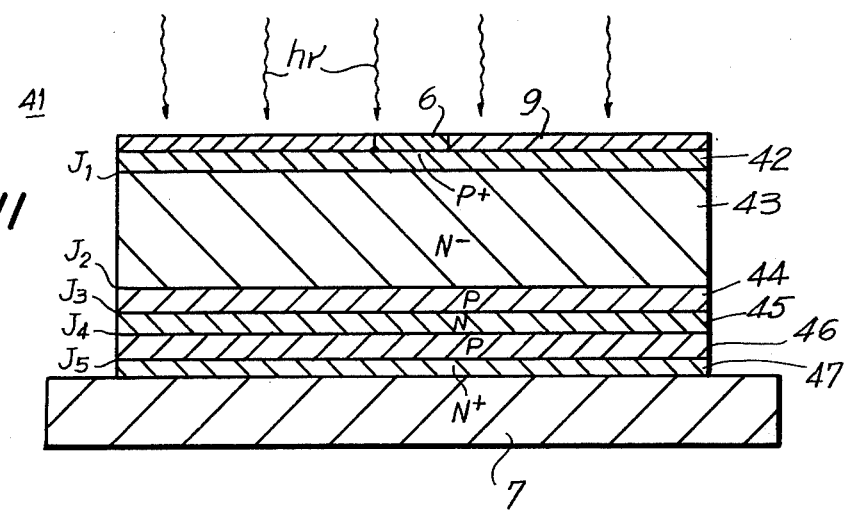
Figure 12:
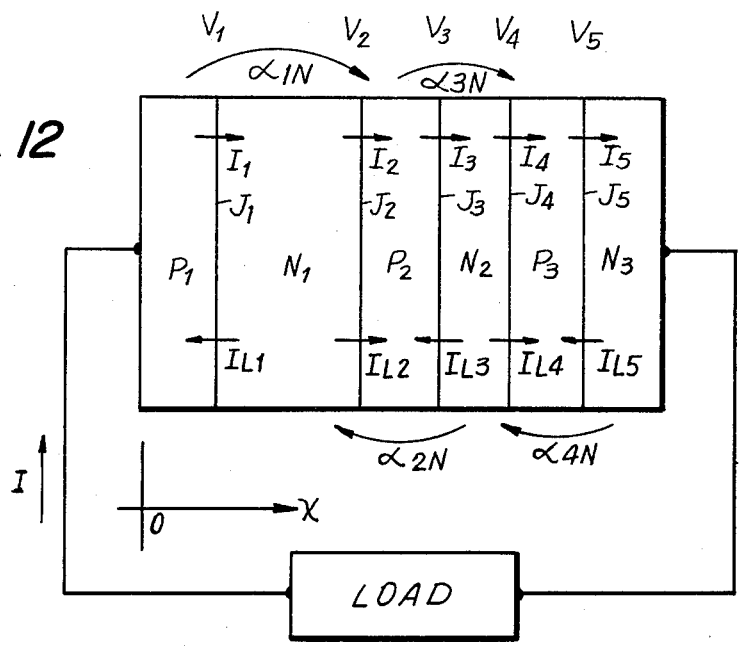
FIG. 12 is useful in explaining how electrical energy is produced by an alternative embodiment of a semiconductor photovoltaic device in accordance with the teachings of the present invention.

Yet another embodiment of a multi-layer semiconductor photoelectric device is illustrated in FIGS. 11 and 12. In this embodiment, the device 41 is formed of six semiconductor layers 42–47, the layers being arranged so that successive layers are of alternating conductivity type material P and N. The outer regions 42 and 47 are of opposite conductivity type material and the contiguous regions define five PN junctions $J_1$-$J_5$. If the photoelectric device 41 in FIG. 11 is compared to the photoelectric device 1 in FIG. 4, it is appreciated that the outer regions 42 and 47 in FIG. 11 correspond to the outer regions 2 and 5 in FIG. 4, and the inner regions 43 and 46 in FIG. 11 correspond to the inner regions 3 and 4 of FIG. 4. Thus, the regions 44 and 45 may be thought of as being inserted between the regions 3 and 4 of FIG. 4. These additional regions 44 and 45 each have a thickness of approximately 5µ and an impurity concentration of $10^{15}$ atoms/cm$^3$. The remaining thicknesses and impurity concentrations of the regions 42, 43, 46 and 47 correspond to that described hereinabove with respect to the regions 2, 3, 4 and 5, respectively.

Since the thickness of each of the inner regions 43–46 is less than the diffusion length of minority carriers therein these region thicknesses can be expressed as follows:

$$W_2 < L_{p2} \qquad (19)$$

$$W_3 < L_{n3} \qquad (20)$$

$$W_4 < L_{p4} \qquad (21)$$

$$W_5 < L_{n5} \qquad (22)$$

Because of these thicknesses, and since there is an accumulation of majority carriers in the respective regions, the device 41 is capable of supporting transistor action. Thus, and with reference to FIG. 12, electrons which are generated at the junction $J_1$ are injected across the junction $J_2$ and are transported into the $N_2$ region by the transistor $N_1P_2N_2$, wherein the $N_1$ region is the transistor emitter. Once the electrons have reached the $N_2$ region, they are injected across the junction $J_4$ into the $P_3$ region and then are transported into the $N_3$ region by the transistor $N_2P_3N_3$. Also, holes which are generated at the junction $J_2$ are injected into the $N_1$ region and transported to the $P_1$ region by the transistor $P_2N_1P_1$. The electrons which are generated at the junction $J_2$ are transported to the region $N_3$ by the transistors $N_1P_2N_2$ and $N_2P_3N_3$. Holes which are generated at the junction $J_3$ are transported to the region $P_1$ by the transistor $P_2N_1P_1$, and electrons which are generated at the junction $J_3$ are transported to the $N_3$ region by the transistor $N_2P_3N_3$. Thus, substantially all of the charge carriers which are generated in the inner regions are derived at the respective outer regions $P_1$ and $N_3$ from which they may be applied to a load.

The 6-layer embodiment of FIGS. 11 and 12 can be analyzed in accordance with principles set forth in analyzing the 4-layer embodiment described hereinabove. It will be recognized that the various current amplification factors may be defined as follows:

$\alpha_{1N}$ is the normal current amplification factor for the transistor $P_1N_1P_2$ wherein the $P_1$ region is the transistor emitter.

$\alpha_{2N}$ is the normal current amplification factor of the transistor $N_2P_2N_1$ wherein the $N_1$ region is the transistor emitter.

$\alpha_{3N}$ is the normal current amplification factor of the transistor $P_2N_2P_3$, wherein the $P_2$ region is the transistor emitter.

$\alpha_{4N}$ is the normal current amplification factor of the transistor $N_3P_3N_2$ wherein the $N_3$ region is the transistor emitter.

$\alpha_{1I}$ is the inverse current amplification factor for the $P_1N_1P_2$ transistor. That is, here the $P_2$ region may be considered as the inverse transistor emitter.

$\alpha_{2I}$ is the inverse current amplification factor for the aforementioned $N_2P_2N_1$ transistor.

$\alpha_{3I}$ is the inverse current amplification factor for the aformentioned $P_2N_2P_3$ transistor.

$\alpha_{4I}$ is the inverse current amplification factor for the aforementioned $N_3P_3N_2$ transistor.

Using these parameters and following the procedure outlined hereinabove in the mathematical analysis of the 4-layer photoelectric device, the following matrix equation is derived for the 6-layer device shown in FIGS. 11 and 12:

$$\begin{bmatrix} I_{S1}\left(\exp\left(\frac{qV_1}{AkT}\right)-1\right) \\ I_{S2}\left(\exp\left(\frac{-qV_2}{AkT}\right)-1\right) \\ I_{S3}\left(\exp\left(\frac{qV_3}{AkT}\right)-1\right) \\ I_{S4}\left(\exp\left(\frac{-qV_4}{AkT}\right)-1\right) \\ I_{S5}\left(\exp\left(\frac{qV_5}{AkT}\right)-1\right) \end{bmatrix} \begin{bmatrix} 1 & -\alpha_{1I} & 0 & 0 & 0 \\ \alpha_{1N} & -1 & \alpha_{2N} & 0 & 0 \\ 0 & -\alpha_{2I} & 1 & -\alpha_{3I} & 0 \\ 0 & 0 & \alpha_{3N} & -1 & \alpha_{4N} \\ 0 & 0 & 0 & -\alpha_{4I} & 1 \end{bmatrix}^{-1} \begin{bmatrix} I+I_{L1} \\ I-I_{L2} \\ I+I_{L3} \\ I-I_{L4} \\ I+I_{L5} \end{bmatrix} \qquad (23)$$

Since the current is continuous through the device, the following expression is applicable:

$$I_1=I_2=I_3=I_4=I_5=I \qquad (24)$$

Also, since the output voltage V is equal to the summation of the junction voltages, the following equation is applicable:

$$V=V_1+V_2+V_3+V_4+V_5 \qquad (25)$$

If equations (24) and (25) are used to solve the matrix equation (23), the results are found to be the same as those which have been mathematically derived for the 4-layer embodiment. Thus, the normal current amplification factors for those transistors whose emitters constitute the outer regions $P_1$ and $N_3$, respectively, are found to exhibit the following range:

$$0.65 \leq \alpha_{1N}, \alpha_{4N} < 1 \qquad (26)$$

Also, the remaining normal and inverse current amplification factors are found to be within the following range:

$$0.2 \leq \alpha_{2N}, \alpha_{3N}, \alpha_{1I}, \alpha_{2I}, \alpha_{3I}, \alpha_{4I} \leq 0.7 \qquad (27)$$

Thus, it is seen that the normal amplification factor for the transistor $P_1N_1P_2$, and the normal amplification factor for the transistor $N_3P_3N_2$ correspond to $\alpha_{1N}$ and $\alpha_{4N}$, respectively.

Figure 13:
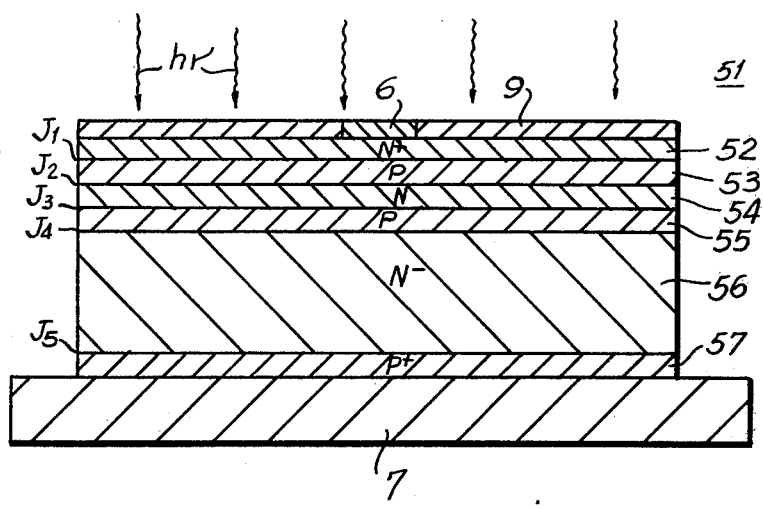
FIG. 13 shows yet another embodiment of a multi-layer semiconductor photovoltaic device in accordance with the teachings of this invention.

It is appreciated that, in the embodiment shown in FIG. 11, most of the junctions $J_2-J_5$ are remote from the light incident surface. That is, if the region 43 is the substrate, then the junctions $J_2-J_5$ will be separated from the light incident surface by more than 90% of the total thickness of the device. Hence, the FIG. 11 embodiment is seen to be sensitive to the long wavelength of the light spectrum, and thus is responsive to light of a lower energy. Turning to FIG. 13, another embodiment of this invention is shown which is substantially an inverted replica of the FIG. 11 embodiment. Since most of the PN junctions $J_1-J_4$ are relatively close to the light incident surface in the FIG. 13 embodiment, it is appreciated that this embodiment is sensitive to the short wavelengths in the spectrum, and thus utilized light having a higher energy.

It should be appreciated that the present invention need not be limited solely to 4-layer and 6-layer structures. Rather, the teachings of this invention are applicable to 2n layer structures, wherein n is an integer greater than one. Stated otherwise, the present invention relates to a multilayer semiconductor photoelectric device wherein the two outer layers are of opposite conductivity type material and the structure is formed of 2n layers of alternate conductivity type, wherein n is an integer, in this case equal to one or more.

As noted above, it has been found that heavily doped regions act to attenuate light which is transmitted therethrough. Accordingly, it is preferred that the heavily doped outermost region which defines the light incident surface have a thickness smaller than $1.0\mu$ so that the light is not significantly attenuated. A relatively thin outer layer thus will permit light to penetrate the device and to excite each of the layers. Of course, it is preferred to provide heavy doping at the outermost layers so as to obtain the highest current amplification factor, thereby improving the photoelectric efficiency and increasing the output voltage produced by the device.

Whereas the foregoing discussion has assumed that each of the respective junctions is a PN junction, it should be noted that hetero junctions can be formed, if desired. The hetero junction has different gap energies on either side thereof.

Also, the semiconductor crystal can be a monocrystal, a polycrystal or a ribbon crystal, as desired. Typical semiconductor materials which can be used are silicon, germanium or a typical III–V compound.

Furthermore, the aforedescribed impurity concentrations are given by way of example only. These impurity concentrations can be changed, as desired. For example, the doping of some regions can be higher or lower than others.

In considering the energy conversion efficiency $\eta$, this efficiency factor generally is defined as:

$$\eta = \frac{\text{maximum output (mW)}}{\text{(incident light energy)} \times \text{(effective area)}} \qquad (28)$$
$$\text{(mW/cm}^2\text{)} \qquad \text{(cm}^2\text{)}$$

The theoretical maximum efficiency factor of a silicon cell is believed to be between 22 and 24% Contrary to this theoretical maximum, the actual efficiency factor of a silicon photoelectric device is between 10 and 15%. By the present invention, the efficiency factor is increased so as to be between 17 and 20%.

Figure 14:
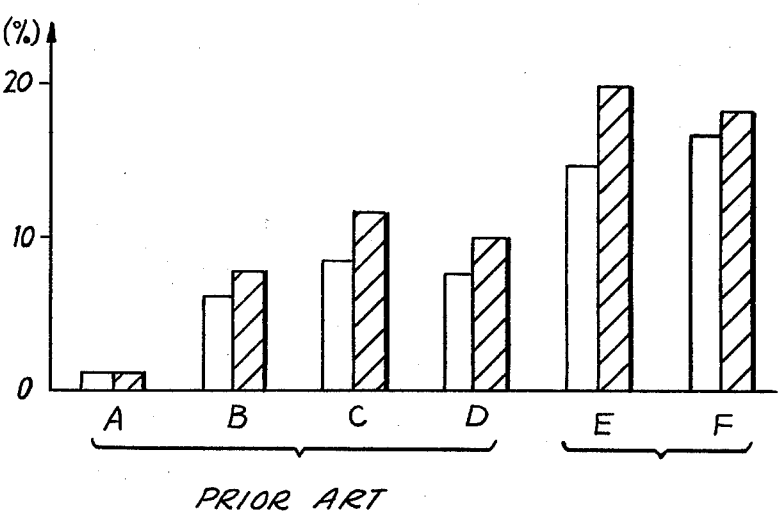
FIG. 14 is a graphical comparison of the improved efficiency which is achieved by the semiconductor photovoltaic device of this invention over the efficiency of the prior art.

A comparison between the efficiency attained by the multi-layer device in accordance with the present invention and typical prior art 2-layer devices is shown in FIG. 14. Samples A, B and C are commercially available 2-layer silicon photoelectric devices. Sample D is a 2-layer silicon photoelectric device manufactured in accordance with conventional techniques. Samples E is a 6-layer photoelectric device of the type described hereinabove with respect to FIG. 11. Sample F is a 4-layer photoelectric device of the type described hereinabove with respect to FIG. 4. In the illustrated graphical comparison, the cross-hatched bars represent the respective efficiencies of the devices in response to tungsten-light whose maximum energy is in a longer wavelength of the spectrum than the maximum energy of solar light. The remaining uncross-hatched bars represent the efficiencies of the respective samples in response to solar light. It is seen that the efficiency of Sample E (the FIG. 11 embodiment) and the efficiency of Sample F (the FIG. 4 embodiment) both are greater than the efficiencies of the prior art samples A-D. The efficiency of Sample F (FIG. 4) in response to solar light is greater than the efficiency of Sample E (FIG. 11) because the PN junctions in the Sample F are closer to the light incident surface than are the PN junctions of the sample E. Since solar light has a maximum energy in the short wavelength of the spectrum, the FIG. 4 embodiment is more sensitive thereto, and thus is more efficient. Conversely, the efficiency of the Sample E (FIG. 11) in response to tungsten light is higher than the efficiency of Sample F (FIG. 4). This is because the PN junctions in the FIG. 11 embodiment are farther from the light incident surface than are the PN junctions of the FIG. 4 embodiment, and thus are more sensitive to the longer wavelengths of the spectrum.

As another indication of the advantageous results achieved by the present invention, the collection efficiency $\rho$ coll of the multi-layer semiconductor photoelectric device of this invention is compared to that of the prior art photoelectric device. The collection efficiency is defined as:

$$\eta_{coll} = \frac{\text{separated electron-hole pairs}}{\text{generated electron-hole pairs}} \quad (29)$$

It has been found that the collection efficiency of the device in accordance with the present invention is almost 100%, whereas the prior art photoelectric device has a collection efficiency of about 72%.

Figure 15:
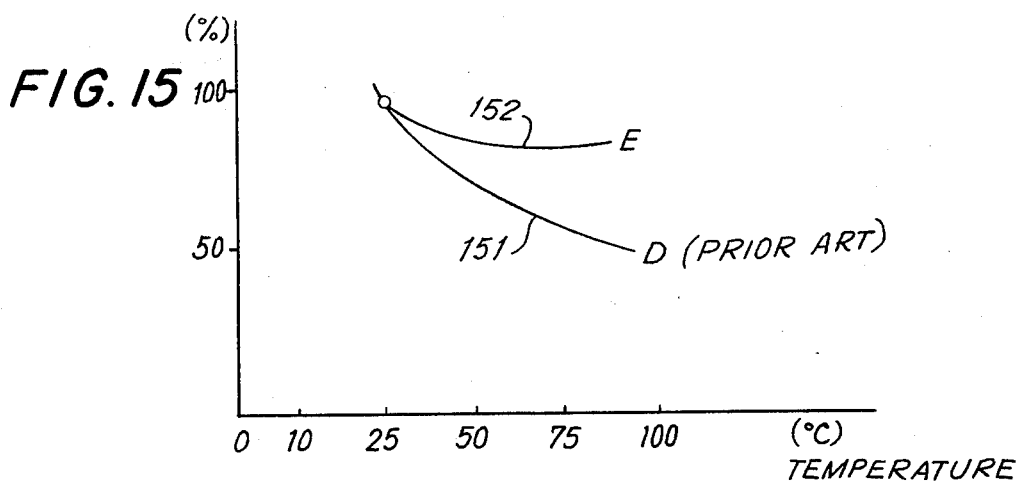
FIG. 15 is a graphical comparison of the relative stability of the output produced by the semiconductor photovoltaic device of this invention as ambient temperature varies.

Another indication of the advantageous results attained by this invention is depicted in the graphical illustration of FIG. 15. This graph shows the change in the relative output of the photoelectric device as the ambient temperature changes. The curve 151 represents the temperature dependent output characteristic of a prior art device, such as the aforementioned Sample D, and the curve 152 represents the temperature-dependent output characteristic of the Sample E (FIG. 11). The respective curves are normalized for a temperature of 23°C. As in apparent, at the higher temperatures, the output produced by the multi-layer photoelectric device of this invention is relatively stable. That is, as the temperature increases, the change in the output appears to be substantially zero. This is because the output current of the device increases with an increase in temperature, while the output voltage decreases.

Figure 16:
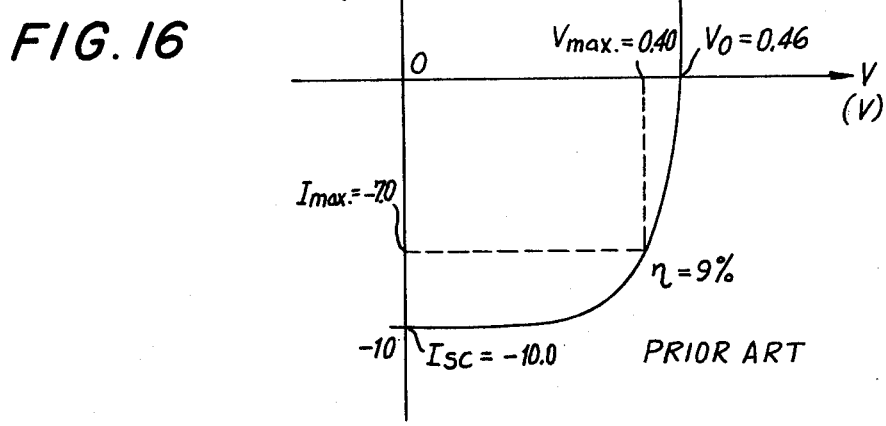
FIGS. 16 and 17 are graphical representations of the voltage-current relationship of a prior art device and of the semiconductor photovoltaic device of this invention.
Figure 17:
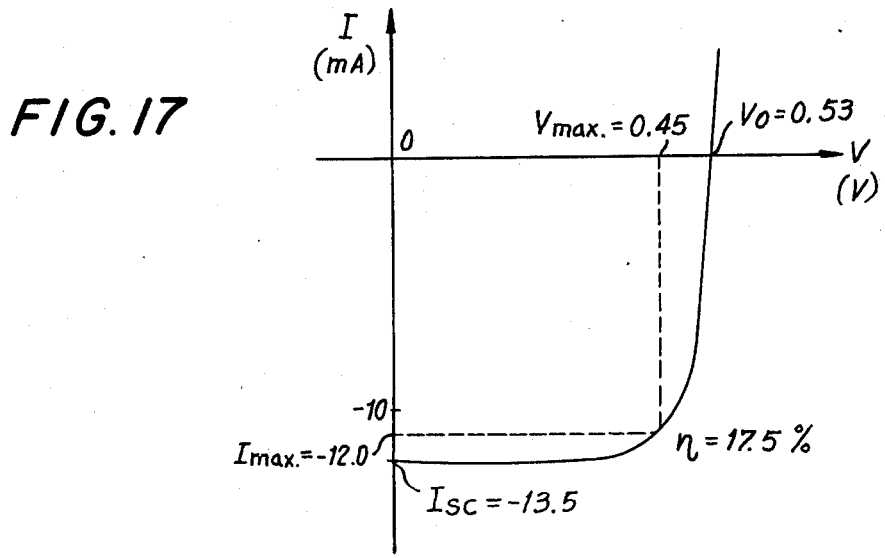

A further comparison between the operating characteristics of the prior art device, such as a Sample D, and the present invention, such as the Sample E (FIG. 11) is shown in FIGS. 16 and 17. These figures depict the voltage-current relationship of the prior art device and the present invention, respectively. This relationship graphically shown in the fourth quadrant because the output current has been defined as negative. It is seen that the present invention permits higher output currents and a higher output voltage, with a consequential increase in efficiency than has heretofore been attained.

Figure 18:
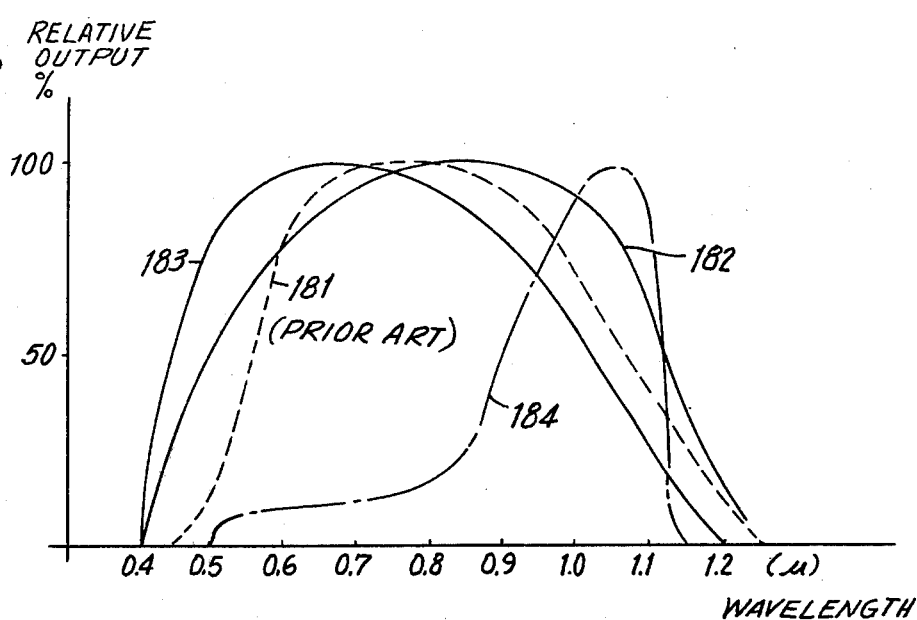
FIG. 18 is a graphical representation of the relationship between the output produced by a photovoltaic device in response to the wavelength of the incident light, and is useful in showing the improved results which are achieved by the present invention.

The relationship between the relative output of the photoelectric device as a function of the wavelength of the incident light is shown, for various devices, in FIG. 18. The curve 181 depicts this relationship for a prior art device, such as the Sample D. The curve 182 represents this relationship for the embodiment of the present invention which has been shown and described with respect to FIG. 10. The curve 182 shows that, since the PN junctions are farther away from the light incident surface, maximum output is attained in response to light energy in the higher wavelength portion of the spectrum. The curve 183 represents the relationship between output and wavelength for the embodiment shown and described with respect to FIG. 9. This curve shows that since the Pn junctions all are relatively close to the light incident surface, the device is most sensitive to, and thus has its highest output, in response to light whose energy is in the lower wavelength portion of the spectrum. The curve 184 represents the output of a silicon device which has four layers, but does not provide the inner layers with a thickness less than the minority carrier diffusion length, and which does not support transisitor action. Thus, the thickness of each inner region is greater than $300\mu$, and the summation of the normal current amplification factors $(\alpha_{1N}+\alpha_{2N})$ is less than unity. This, of course, is contrary to the present invention wherein the thickness of each inner region is less than the minority carrier diffusion length, and wherein the summation of the normal amplification factors is approximately 2. All of the curves shown in FIG. 18 have been normalized for their respective maximum outputs.

As described hereinabove, for the embodiment of a 4-layer device, it is desirable that each of the inverse current amplification factors lie within the range 0.2 and 0.7 . It has been found experimentally that if $\alpha_{1I}$ is approximately 0.1 to 0.2, and $\alpha_{2I}$ is approximately 0.8 to 0.9, the efficiency of the photoelectric device is approximately 5%. The influence of the inverse current amplification factors thus is readily appreciated.

Figure 19:
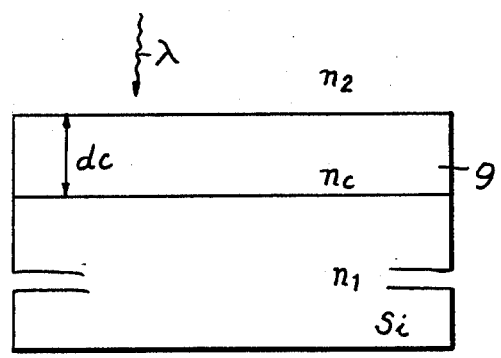
FIG. 19 schematically represents the particular type of optical coating which is applied to the semiconductor photovoltaic device of this invention.

Referring now to FIG. 19, the manner in which the non-reflective coating 9 is selected will be explained. In order to minimize reflection of the incident light, and thus reduce the optical losses in the photoelectric device, the index of refraction $n_c$ of the coating 9 should satisfy the following:

$$n_c^2 = n_1 n_2 \quad (30)$$

$$n_c d_c = \frac{\lambda}{4} \quad (31)$$

where $n_1$ is the index of refraction of the silicon layer upon which the coating 9 is applied, $n_2$ is the index of refraction of air, $d_c$ is the thickness of the coating and $\lambda$ is the wavelength of incident light. In one embodiment, the coating 9 is formed of a polycrystal silicon layer containing oxygen in the amount of 65% by weight. The index of refraction $n_c$ of the coating 9 can be changed from 1.44 to 4.5 by changing the oxygen content. Also, the polycrystal silicon layer can contain nitrogen. It may be recognized that, in addition or providing a nonreflective coating, the polycrystal layer also serves as a passivation layer on the silicon device.

While the present invention has been particularly shown and described with reference to certain preferred embodiments thereof, it will be obvious to those skilled in the art that the foregoing and various other changes and modifications in form in details may be made without departing from the spirit and scope of the invention. It is therefore intended that the appended claims be interpreted as including all such changes and modifications.

What is claimed is:

1. A semiconductor photovoltaic device comprised of 2n contiguous stacked regions of semiconductor material arranged so that successive regions are of alternating conductivity type material, wherein n is an integer greater than one, the outer regions being of opposite conductivity type material and each inner region having a thickness less than the diffusion length of a minority carrier therein, said contiguous regions defining (2n-1)PN junctions, respectively, therebetween, said regions being excited by incident light that successively traverses each said region in said stack to cause charge carriers to be produced, said outer regions collecting charge carriers of opposite polarity, and each respective outer region cooperating with the next succeeding two inner regions to support transistor action to urge majority charge carriers in an inner region to traverse at least two junctions toward said respective outer region, whereby said photovoltaic device functions as a source of electrical energy to supply current from said outer regions to a load.

2. A semiconductor photovoltaic device in accordance with claim 1 wherein a first of said outer regions and said next succeeding two inner regions comprise a first transistor whose emitter is said outer region and wherein the other outer region and said next succeeding two inner regions comprise a second transistor whose emitter is said other outer region, the current amplification factor of each said transistor is greater than 0.65.

3. A semiconductor photovoltaic device in accordance with claim 1 wherein a first of said outer regions and said next succeeding two inner regions comprise a first transistor whose collector is said outer region and wherein the other outer region and said next succeeding two inner regions comprise a second transistor whose collector is said other outer region, the current amplification factor of each said transistor is within the range 0.2 to 0.7.

4. A semiconductor photovoltaic device in accordance with claim 2 wherein three successive regions comprise a transistor whose emitter is one of said inner regions and whose current amplification factor is within the range 0.2 to 0.7.

5. A semiconductor photovoltaic device in accordance witn claim 1 wherein one of said outer regions has a layer of like conductivity type material of impurity concentration greater than that of said one outer region diffused into the outer surface thereof to thereby form a junction in said one outer region at said layer of greater impurity concentration.

6. A semiconductor photovoltaic device in accordance with Claim 5 wherein the other of said outer regions has a layer of like conductivity type material of impurity concentration greater than that of said other outer region diffused into the outer surface thereof to thereby form a junction in said other outer region at said layer of greater impurity concentration.

7. A semiconductor photovoltaic device in accordance with claim 6 wherein one of said outer regions comprises a substrate whose outer surface is adapted to receive incident light and whose thickness is approximately 90% of the overall thickness of said device, said junction at said layer of greater impurity concentration in said substrate being spaced from the PN junction at said substrate by less than the diffusion length of a minority carrier in said substrate.

8. A semiconductor photovoltaic device in accordance with claim 6 wherein one of said outer regions comprises a substrate whose thickness is approximately 90% of the overall thickness of said device, and wherein the outer surface of said other outer region is adapted to receive incident light, whereby all of said PN junctions are relatively close to said light receiving surface.

9. A semiconductor photovoltaic device in accordance with claim 1 wherein one of said inner regions comprises a substrate whose thickness is greater than 90% of the overall thickness of said device.

10. A semiconductor photovoltaic device in accordance with claim 9 wherein light is incident on the outer surface of one of said outer regions and most of said Pn junctions are disposed closer to the light incident surface than to the other of said outer regions.

11. A semiconductor photovoltaic device in accordance with claim 9 wherein light in incident on the outer surface of one of said outer regions and most of said PN junctions are disposed closer to the other of said outer regions than to the light incident surface.

12. A semiconductor photovoltaic device comprised of 2n layers of alternating P-type and N-type material having respective PN junctions between adjacent layers, wherein n in an integer greater than 1, each having a thickness less than the diffusion length of a minority carrier therein, said layers being excited by light incident on said device to thereby cause majority carriers to be accumulated in said respective layers so as to forward bias all of said PN junctions and wherein a first set of three successive layers comprise a pnp transistor having a current amplification factor greater than 0.65 and an inverse current amplification factor between 0.2 and 0.7 and a second set of three successive layers comprise an npn transistor having a current amplification factor greater than 0.65 and an inverse current amplification factor between 0.2 and 0.7.

13. A semiconductor photovoltaic device in accordance with claim 12 comprised of four layers wherein successive P-type, N-type and P-type layers comprise said pnp transistor so that current is derived from the outer P-type layer; and wherein successive N-type, P-type and N-type layers comprise said npn transistor so that an opposite current is derived from the outer N-type layer.

14. A semiconductor photovoltaic device in accordance with claim 12 wherein one major surface of said device is adapted to receive incident light and wherein at least a portion of said one major surface has a non-reflective coating thereon.

15. A semiconductor photovoltaic device in accordance with claim 14 wherein said one major surface of said device additionally has a first electrode thereon, and the opposite major surface of said device has a second electrode thereon.

16. A semiconductor photovoltaic device in accordance with claim 15 wherein the respective outer layers are provided with a greater impurity concentration than the inner layers.

17. A semiconductor photovoltaic device comprised of six layers of alternating P-type and N-type material having respective Pn junctions between adjacent layers, each having a thickness less than the diffusion length of a minority carrier therein, said layers being excited by light incident on said device to thereby cause majority carriers to be accumulated in said respective layerrs so as to forward bias all of said PN junctions and wherein a first set of successive P-type, N-type and P-type layers comprise a first pnp transistor having a current amplification factor $\alpha_{1N}$ greater than 0.65 and an inverse current amplification factor $\alpha_{1I}$ between 0.2 and 0.7; wherein a first set of successive N-type, P-type and N-type layers comprises a first npn transistor having a current amplification factor $\alpha_{2N}$ and an inverse current amplification factor $\alpha_{2I}$ both between 0.2 and 0.7; wherein a second set of successive P-type, N-type and P-type layers comprises a second pnp transistor having a current amplification factor $\alpha_{3N}$ and an inverse current amplification factor $\alpha_{3I}$ both between 0.2 and 0.7; and wherein a second set of successive N-type, P-type and N-type layers comprises a second npn transistor having a current amplification factor $\alpha_{4N}$ greater than 0.65 and an inverse current amplification factor $\alpha_{4I}$ between 0.2 and 0.7, whereby the outer P-type and N-type layers of said device are adapted to supply current to a load coupled thereto.

18. A semiconductor photovoltaic device comprised of at least four layers of alternating P-type and N-type material disposed in stacked configuration having a first outer layer of P-type material and a second outer layer of N-type material, adjacent layers defining respective PN junctions and each layer having a thickness less than the diffusion length of a minority carrier therein, said layers being excited by light that is incident on one of said outer layers and passes through said stack to create hole-electron pairs in each said layer, and wherein said first outer layer and next two adjacent layers form a pnp transistor and said second outer layer and next two adjacent layers form an npn transistor, the sum of the current amplification factors of said pnp transistor and said npn transistor with said respective outer layers constituting collectors being approximately equal to unity and the sum of the current amplification factors of said pnp transistor and said npn transistor with said respective outer layers constituting emitters being greater than unity but less than two whereby the outer P-type and N-type layers of said device are adapted to supply current to a load coupled thereto.

* * * * *